US012744521B2

(12) United States Patent
Lau et al.

(10) Patent No.: US 12,744,521 B2
(45) Date of Patent: Sep. 22, 2026

(54) CALIBRATED DELAY LINES FOR GENERATION OF ACCURATE AND PROGRAMMABLE PHASE DELAYS BETWEEN OUTPUTS OF FREQUENCY DIVIDERS

(71) Applicant: Samsung Electronics Co., Ltd., Gyeonggi-do (KR)

(72) Inventors: Chung Y. Lau, Sunnyvale, CA (US); Sai Krishna Rayudu, Austin, TX (US)

(73) Assignee: Samsung Electronics Co., Ltd (KR)

( * ) Notice: Subject to any disclaimer, the term of this patent is extended or adjusted under 35 U.S.C. 154(b) by 160 days.

(21) Appl. No.: 18/418,700

(22) Filed: Jan. 22, 2024

(65) Prior Publication Data

US 2025/0080097 A1 Mar. 6, 2025

Related U.S. Application Data

(60) Provisional application No. 63/535,790, filed on Aug. 31, 2023.

(51) Int. Cl.
*H03K 5/14* (2014.01)
*H03K 5/00* (2006.01)
(Continued)

(52) U.S. Cl.
CPC ........... *H03K 5/14* (2013.01); *H03K 5/00006* (2013.01); *H03L 7/089* (2013.01); *H03L 7/099* (2013.01); *H03K 2005/00286* (2013.01)

(58) Field of Classification Search
CPC .......... H03K 5/131; H03K 5/14; H03K 5/133; H03K 5/135; H03K 3/0315; H03K 5/1565; H03K 2005/00019; H03K 5/00006; H03K 2005/00143; H03K 3/0322; H03K 5/00; H03K 5/082; H03K 19/20; H03K 2005/00058; H03K 2005/00234; H03K 2005/00286; H03K 21/02; H03K 5/01; H03K 2005/00071; H03K 23/40; H03K 23/68; H03K 5/134; H03K 2005/00195; H03K 21/00; H03K 21/10; H03K 21/38; H03K 3/012; H03K 5/05; H03K 5/15033; H03K 5/1515; H03K 5/26;
(Continued)

(56) References Cited

U.S. PATENT DOCUMENTS 8,411,517 B2 * 4/2013 Choi .................... G11C 29/028 327/158
9,509,351 B2 11/2016 Shaw et al.
(Continued)

FOREIGN PATENT DOCUMENTS

EP 2427968 11/2010
EP 2929638 1/2017

*Primary Examiner* — John W Poos
(74) *Attorney, Agent, or Firm* — The Farrell Law Firm, P.C.

(57) ABSTRACT

A system and a method are disclosed for generating accurate and programmable phase delay output signals, including a phase detector unit configured to determine a phase disparity signal based on a phase error between outputs of a frequency divider unit cell; a digital calibration logic unit configured to generate a control signal based on the phase disparity signal; and a tunable delay lines unit configured to generate the phase delay output signals based on the control signal.

20 Claims, 8 Drawing Sheets

(51) Int. Cl.
*H03L 7/089* (2006.01)
*H03L 7/099* (2006.01)

(58) Field of Classification Search
CPC ........... H03K 19/018521; H03K 19/21; H03K 21/023; H03K 23/42; H03K 23/50; H03K 3/017; H03K 5/08; H03K 5/13; H03K 5/15013; H03K 5/15046; H03K 5/1506; H03K 5/06; H03K 5/15006; H03L 7/099; H03L 7/1976; H03L 2207/50; H03L 7/085; H03L 7/18; H03L 7/087; H03L 7/093; H03L 7/081; H03L 7/0814; H03L 7/091; H03L 7/0995; H03L 7/08; H03L 7/0816; H03L 7/07; H03L 7/0991; H03L 7/0992; H03L 7/1974; H03L 2207/06; H03L 7/23; H03L 7/089; H03L 7/0891; H03L 7/0818; H03L 7/0805; H03L 7/235; H03L 1/00; H03L 7/16; H03L 7/24; H03L 7/00; H03L 7/0812; H03L 7/113; H03L 7/183; H03L 7/0807; H03L 7/083; H03L 7/095; H03L 7/145; H03L 7/187; H03L 7/199; H03L 7/0996; H03L 7/0997; H03L 7/1075; H03L 7/107; H03L 7/197; H03L 7/0895; H03L 7/0896; H03L 7/0994; H03L 7/193; H03L 7/22; H03L 7/0802; H03L 7/0998; H03L 1/026; H03L 7/195; H03L 1/022; H03L 7/0893; H03L 7/0898; H03L 7/104; H03L 7/1077; H03L 2207/08; H03L 7/06; H03L 7/097; H03L 7/10; H03L 7/1072; H03L 7/1806; H03L 7/191; H03L 2207/10; H03L 7/103; H03L 7/14; H03L 7/148; H03L 7/189
See application file for complete search history.

(56) References Cited

U.S. PATENT DOCUMENTS 11,303,741 B2 4/2022 Jung et al.
2003/0011414 A1* 1/2003 Bell ...................... H03K 5/133 365/194
2006/0022873 A1 2/2006 Zimmerman
2013/0176171 A1 7/2013 Webber et al.
2019/0052278 A1* 2/2019 Pandita ..................... H03L 7/18
2019/0199361 A1* 6/2019 Sudalaiyandi ........ H03L 7/0814
2021/0143807 A1* 5/2021 Kim ...................... H03L 7/0893

* cited by examiner

| Comparator Scenarios | Comparator Outputs | Phase Error Status | Coarse Calibration | Fine Calibration |
| --- | --- | --- | --- | --- |
| V_LPF > VREF_H | OUT_H = 0<br>OUT_L = 1 | Phase Error > Δ | Increase Delay<br>DL_MUX_SEL ↑ | Increase Delay<br>VDD_SEL ↓ |
| VREF_H ≥ V_LPF ≥ VREF_L | OUT_H = 1<br>OUT_L = 1 | Phase Error Within ±Δ | DL_MUX_SEL No Change | VDD_SEL No Change |
| V_LPF < VREF_L | OUT_H = 1<br>OUT_L = 0 | Phase Error < −Δ | Reduce Delay<br>DL_MUX_SEL ↓ | Reduce Delay<br>VDD_SEL ↑ |

FIG. 6

CALIBRATED DELAY LINES FOR GENERATION OF ACCURATE AND PROGRAMMABLE PHASE DELAYS BETWEEN OUTPUTS OF FREQUENCY DIVIDERS

CROSS-REFERENCE TO RELATED APPLICATION

This application claims the priority benefit under 35 U.S.C. § 119 (e) of U.S. Provisional Application No. 63/535,790, filed on Aug. 31, 2023, the disclosure of which is incorporated by reference in its entirety as if fully set forth herein.

TECHNICAL FIELD

The disclosure generally relates to delay calibration. More particularly, the subject matter disclosed herein relates to improvements to programmable phase delays between outputs of frequency dividers.

SUMMARY

Frequency dividers play a pivotal role in numerous electronic applications, especially in communication systems. Particularly, frequency dividers that divide the frequency of a received signal by a certain value, such as an odd divisor, introduce unique challenges. For instance, a divide-by-3 frequency divider produces outputs with phase differences of 0, 120, and 240 degrees. However, many down converters in receivers necessitate local oscillator (LO) signals with a phase difference of exactly 90 degrees (quadrature). Prior art solutions have often been constrained by inefficiencies, lack of precision, or increased power and area consumption.

One conventional solution has been the utilization of multiple phase-locked loops (PLLs). In this method, multiple PLLs are employed to generate various frequencies. These frequencies are then combined, aiming to extract the desired phase shift. While this approach can achieve the necessary phase shift, it introduces significant complexities. The simultaneous operation of several PLLs results in increased power consumption and demands a larger chip area, making this approach less than optimal for certain applications.

Another method has been the deployment of mixer-based phase shifters. These devices function by taking two signals, subsequently producing an output derived from the combination (typically the multiplication) of the two. When used with two signals of the same frequency but with varying phases, the outcome can be a phase-shifted version of the initial signal. However, while mixers can generate the necessary phase shift, they introduce amplitude variations. Furthermore, additional calibration circuits might be a prerequisite, and the method often consumes much power.

An alternative approach involves the use of resistor-capacitor (RC) phase shift networks. These networks consist of a series of resistors and capacitors strategically arranged to introduce phase shifts between input and output signals. Despite their ability to provide accurate phase shifts, their efficacy dwindles with frequency. Especially at the higher frequencies prevalent in communication systems, these networks are prone to signal losses. The practicality of this solution is further compromised due to the inherent limitations of component tolerances and parasitic elements at such frequencies.

Additionally, some designs have turned to quadrature voltage-controlled oscillators (QVCOs). These oscillators are specifically designed to generate two output signals with an inherent 90-degree phase difference. While efficient in generating quadrature signals, QVCOs require intricate designs. They may not be universally suitable due to potential stability issues and noise considerations.

The present application addresses these challenges by implementing calibrated delay lines to produce accurate 90-degree (quadrature) output signals from frequency dividers. Additionally, the proposed solutions are versatile enough to generate outputs with arbitrary phase differences, not limited to 90 degrees.

In an embodiment, a method for generating accurate and programmable phase delay output signals comprises determining, via a phase detector unit, a phase disparity signal based on a phase error between outputs of a frequency divider unit cell; generating, via a digital calibration logic unit, a control signal based on the phase disparity signal; and generating, via a tunable delay lines unit, the phase delay output signals based on the control signal.

In an embodiment, a system for generating accurate and programmable output signals comprises a phase detector unit configured to determine a phase disparity signal based on a phase error between outputs of a frequency divider unit cell; a digital calibration logic unit configured to generate a control signal based on the phase disparity signal; and a tunable delay lines unit configured to generate the phase delay output signals based on the control signal.

BRIEF DESCRIPTION OF THE DRAWING

In the following section, the aspects of the subject matter disclosed herein will be described with reference to exemplary embodiments illustrated in the figures, in which:

FIG. 6 is a table illustrating the resulting calibration based on comparator inputs, according to an embodiment;

DETAILED DESCRIPTION

Figure 1:
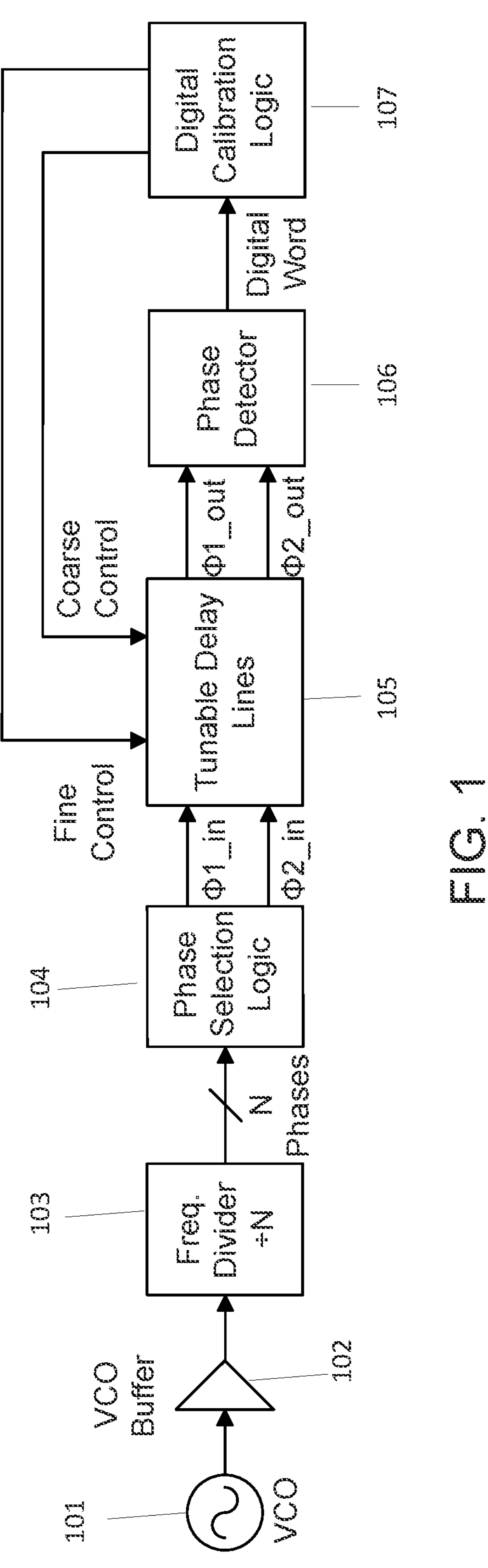
FIG. 1 is a block diagram illustrating a system for generating phase delays, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The present application comprises a phase selection logic that performs initial coarse calibration by selecting appropriate phases to feed to tunable delay lines. The tunable delay lines apply varying amounts of delays to its inputs. As discussed below, phase detector and the digital calibration logic blocks monitor the phase difference between the outputs of the delay lines. This difference in phase is driven to as a programmed value by selecting appropriate taps in the tunable delay lines. This calibration can be continuously applied or only applied during power up and when temperature has changed by more than a predetermined threshold amount.

FIG. 1 is a block diagram illustrating a system for generating phase delays, according to an embodiment.

Referring to FIG. 1, the voltage-controlled oscillator (VCO) 101 can include various types of oscillators, such as a VCO or a digitally-controlled oscillator (DCO). The VCO 101 generates a periodic waveform, such as a sine wave or square wave, whose frequency can be adjusted by an external voltage or digital signal. The VCO 101 transmits a signal to the VCO buffer 102.

The VCO buffer 102 safeguards the signal's integrity by isolating the signal from the subsequent stages in the system, ensuring a stable output signal feeds the frequency divider 103 and protects the oscillator from any potential loading effects.

The frequency divider 103 takes this buffered oscillator signal from the VCO buffer 102 and divides its frequency by a specific factor, denoted as "N". As a result, it produces N distinct clock phases, each having a phase difference of 360/N degrees. For instance, if the factor N is 3, the output will consist of three phases, each separated by 120 degrees.

Two consecutive phases from the output of the frequency divider 103 (separated by 360/N degrees) are fed into the phase selection logic 104. The phase selection logic component 104 estimates which of the identified two consecutive phases are leading or lagging. This estimation ensures that the lag phase is fed along the Φ1_in path, and the lead phase is fed along the Φ2_in path to the tunable delay lines 105.

The remaining output phases of the frequency divider 103 are buffered through a fixed delay element whose delay is matched to that of the phase selection logic component 104 and the tunable delay lines 105.

The selected phases are then introduced into the tunable delay lines 105. These delay lines can add variable delay to the incoming signals, enabling fine-tuning of their phase. They can be adjusted or "tuned" using a coarse control signal and/or a fine control signal (feedback signals). With multiple taps available, a broad spectrum of delay values can be achieved, enabling precise control over the phase.

The phase detector 106 has a range of 180 degrees and enables operation with dividing factors (N) of three or more. The output of the phase detector 106 indicates the phase relationship between the signals input to the phase detector 106. For example, when the two inputs are at quadrature, the phase detector 106 output after filtering by the LPF is at half of the supply voltage of the phase detector 106. This output voltage indicates to the calibration logic 107 how to tune the delay lines (coarse control) and how to adjust the supply voltage of the delay lines (fine control), so that the desired phase difference is reached.

This phase difference is then converted into a digital word, encapsulating the magnitude and direction of the phase error. This digital word is processed by the digital calibration logic 107. Based on the data from the phase detector 106, the digital calibration logic 107 determines the necessary adjustments to the tunable delay lines 105. The digital calibration logic 107 transmits two signals: the coarse control signal and the fine control signal. The coarse control makes larger, more significant adjustments to the delay, while the fine control allows for detailed, precise modifications.

This dynamic feedback loop ensures that the system is continuously monitoring and adjusting the phase of the outputs to remain in alignment with the programmed values. The calibration can either be a continuous process or initiated during specific scenarios, such as during power-up or when there's a significant temperature change. Accordingly, a dynamic and adaptive mechanism is provided to generate clock signals with highly precise, programmable phase differences by leveraging the capabilities of frequency dividers combined with particularly tuned delay lines.

Figure 2:
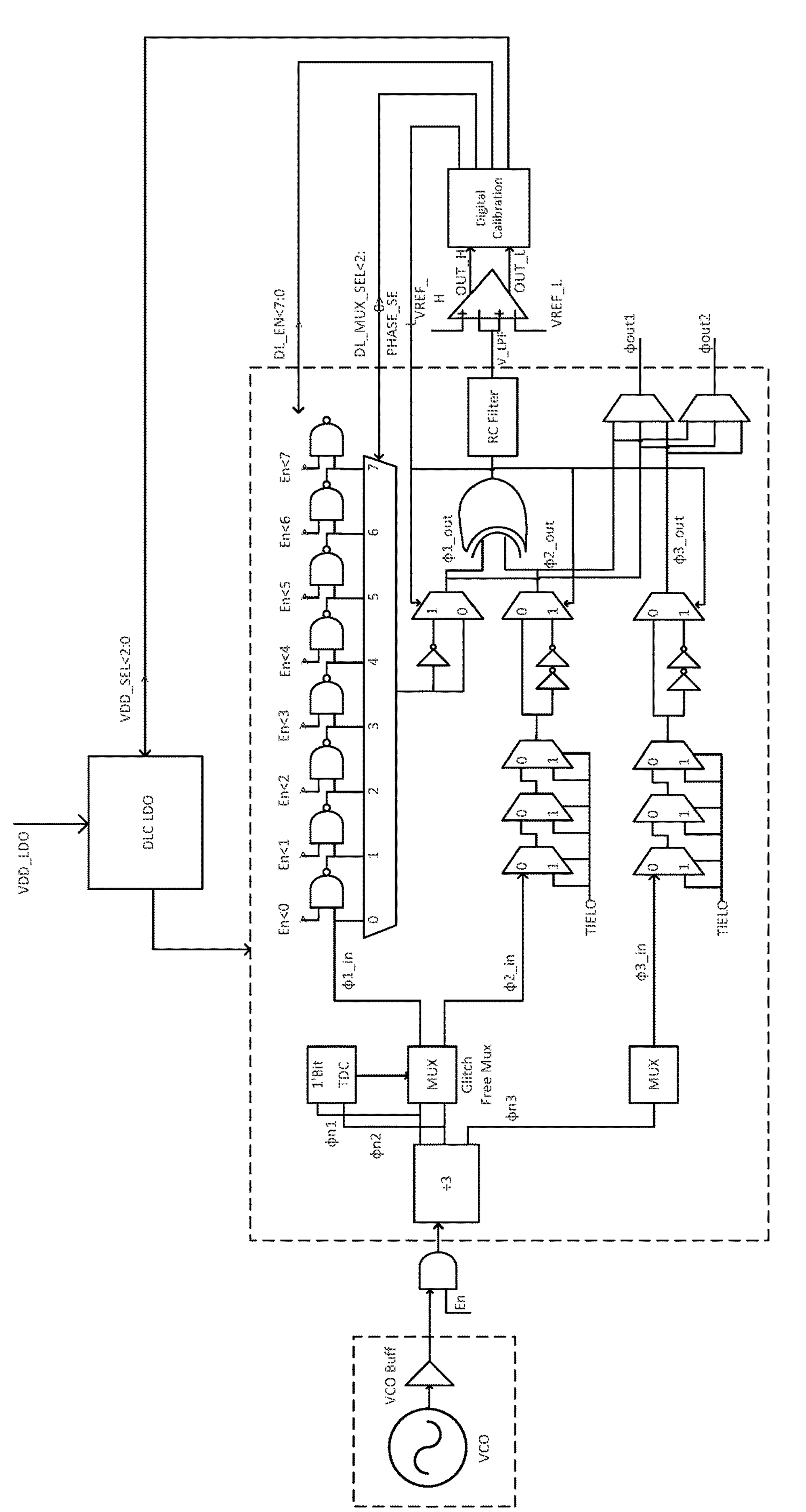
FIG. 2 is an example of a circuit diagram illustrating a system for generating phase delays, according to an embodiment.

FIG. 2 is an example of a circuit diagram illustrating a system for generating phase delays, according to an embodiment.

FIG. 2 shows an implementation of the block diagram of FIG. 1. Some or all of the elements shown in FIG. 2 may be used to implement to features of the block diagram of FIG. 1. Moreover, additional elements can also be used, as FIG. 2 is provided for explanatory purposes. As will be described below, some portions of the circuit diagram of FIG. 2 may correspond to blocks of FIG. 1 to implement the functions of the blocks.

Figure 3:
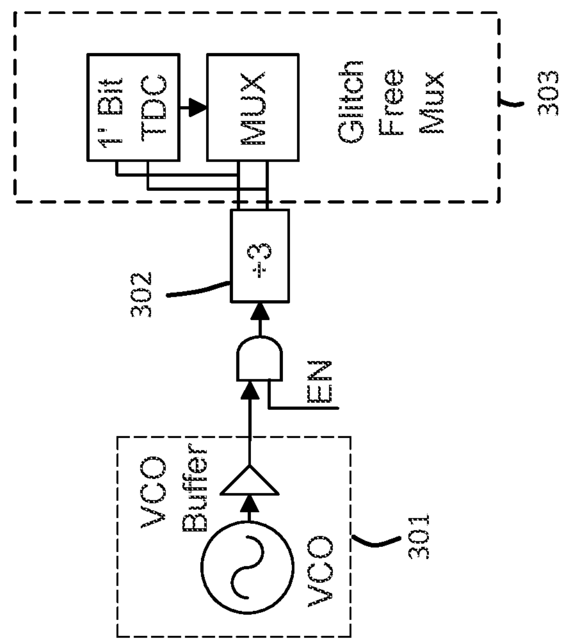
FIG. 3 illustrates an implementation of a phase selection logic component, according to an embodiment.

FIG. 3 illustrates an implementation of a phase selection logic component, according to an embodiment.

Referring to FIG. 3, a VCO component 301 may correspond to the VCO 101 of FIG. 1, a frequency divider component 302 may correspond to the frequency divider 103 of FIG. 1, and the phase selection logic component 303 may correspond to the phase selection logic 104 of FIG. 1.

The phase selection logic component 303 may be used to estimate which input phase is leading or lagging. Included in the phase selection logic component 303 is a 1-bit time-to-digital converter (TDC) and the glitch free MUX. Note that the TDC is used for generating the selection signal to the glitch free MUX.

The 1-BIT TDC is implemented using a D-Flip Flop. The two input phases of phase selection logic are connected to a data and clock port of the flip flop. For a scenario in which the input along a data port leads, the TDC generates an output of logic level 0, and for the scenario where the clock port leads, it generates an output of logic level 1.

Guided by the selection signal from the TDC, the MUX then selects the desired phase along the delay path (Φ1_in) and the reference path (Φ2_in) to a component corresponding to the tunable delay lines 105 of FIG. 1.

Figure 4:
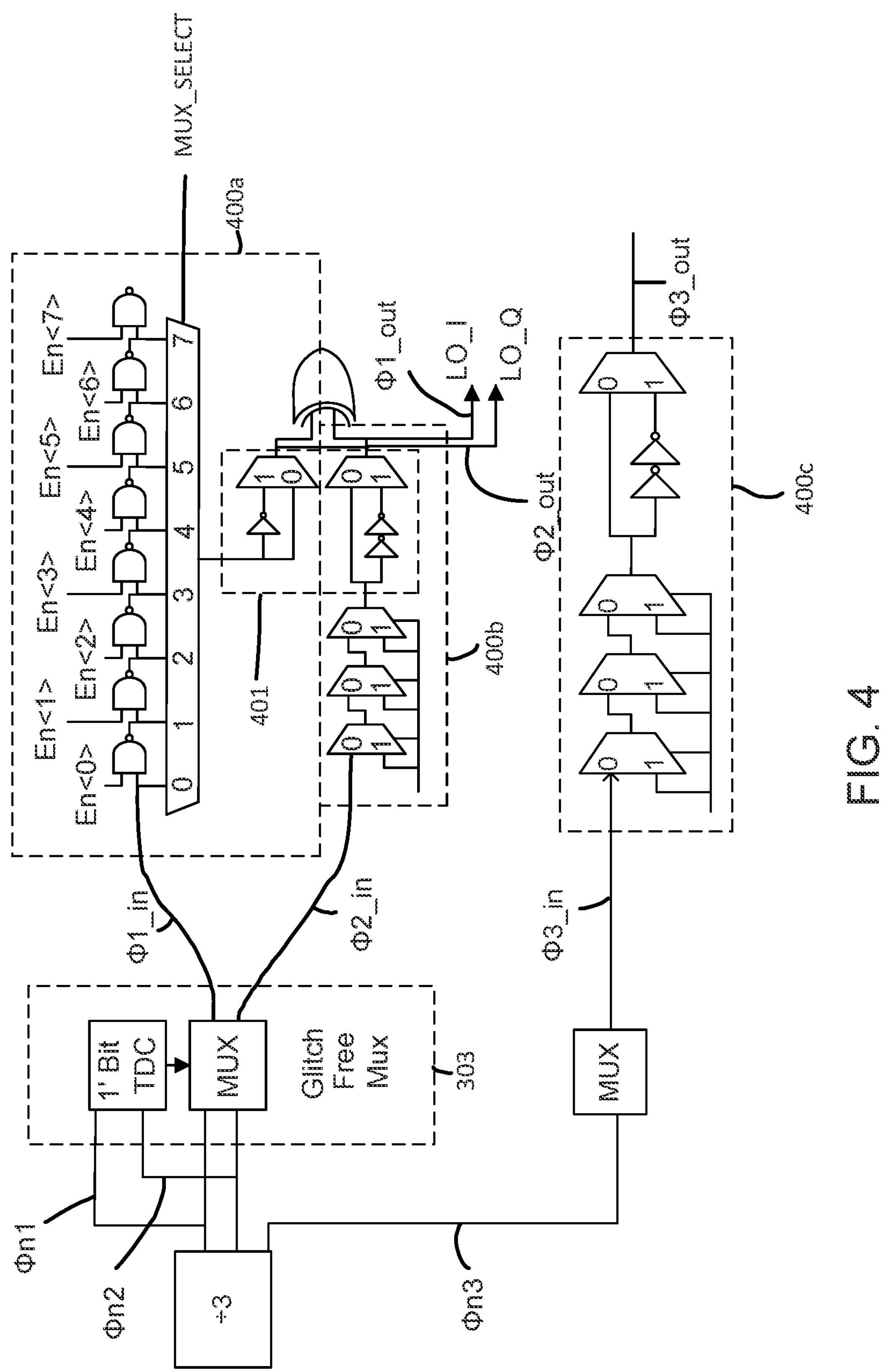
FIG. 4 illustrates a tunable delay lines component, according to an embodiment.

FIG. 4 illustrates a tunable delay lines component, according to an embodiment.

Referring to FIG. 4, the tunable delay lines components **400*a*, 400*b*, and 400*c* (fixed delay along the remaining phases of the output divider) may correspond to the tunable delay lines 105 of FIG. 1. The tunable delay lines components 400*a*, 400*b* and 400*c*** help ensure that the system can achieve accurate and programmable phase delays. This component achieves this through a method of calibration, leveraging both coarse and fine-tuning mechanisms.

The tunable delay lines components **400*a*, 400*b*, and 400*c* are designed to introduce varying amounts of delay to the signals fed into it, thereby achieving the desired phase shift. The tunable delay lines components 400*a*, 400*b*, and 400*c*** utilize an MUX for coarse calibration. Here, the MUX is an electronic component that takes multiple input signals and, based on a selection line (or lines), routes one of these signals to the output. In this setup, the MUX_SELECT is used to choose which signal (e.g., En<0> . . . . EN<7>), among the available ones along the delay path, will proceed further in the system.

As shown in FIG. 4, an 8:1 MUX is used in the tunable delay line component **400*a***. Various other MUX sizes and configurations may also be used. The 8:1 MUX can select one out of eight possible input signals to pass to its output. When signals pass through an MUX, there's an inherent delay introduced, commonly referred to as the propagation delay. This delay is fixed and is a characteristic of the specific MUX being used.

For the system to work effectively, any introduced delays should be accounted for. The input signal Φ1_in for the delay path, which, for example, is fed with a 0-degree phase signal, experiences this fixed MUX delay. To ensure that the reference paths in the tunable delay lines components **400*b* and 400*c*, which, for example are fed with an input signal Φ2_in with a 120 degrees phase signal and Φ3_in with a 240 degrees phase signal, remain coherent with the delay path in the tunable delay line component 400*a*, the same fixed delay introduced by the 8:1 MUX is added to the tunable delay lines components 400*b* and 400*c***. This ensures that the three paths are synchronized in terms of the delays they experience, allowing for more accurate phase calibration.

Thus, the tunable delay lines components **400*a*, 400*b*, and 400*c***, through the use of an MUX and careful synchronization of delays, enables the coarse calibration of phase shifts in the system. By ensuring that both the main delay path and the reference path experience the same delays, the system is better positioned to achieve the precise phase shifts that are desired.

Additionally, the tunable delay lines components **400*a*, 400*b*, and 400*c* include a phase shift logic component 401** which may act as an inverting element to ensure that the main delay path is properly compared to the reference path (Φ2_in).

The tunable delay line is implemented using inverting delay elements (e.g., NAND gates) to achieve a small delay step and a lower power consumption. The NAND unit cell enables gate elements to be clocked after calibration. Also, the inverting delay elements change the polarity for unit change in the MUX selection.

Thus, The NAND gate-based design not only facilitates fine-grained delay adjustments but also contributes to reduced power consumption. This implies that, depending on the selection, the output could be even (in-phase) or odd (out-of-phase) with the input signal Φ1_in. The even-to-odd or odd-to-even selection pertains to the polarity of the output with respect to the original signal.

In scenarios where an odd output is generated, an additional inverter is integrated into the delay chain path. This inverter ensures that the signal undergoes an additional polarity change to achieve the desired odd output. While adding this inverter addresses the polarity concern, it also introduces an additional delay to the signal. To maintain synchronization and phase accuracy, any added delay from this inverter should be counteracted elsewhere in the system.

To compensate for the inverter's introduced delay, a buffer is added along the reference paths for input signal Φ2_in and Φ3_in. However, buffers introduce some degree of delay, albeit minimal. In this setup, the buffer's delay is chosen to match the delay introduced by the inverter in the delay chain path. Thus, three paths (the main delay path with the inverter and the reference paths with the buffer) remain synchronized.

In addition, fine calibration may be applied by changing a supply voltage or by adjusting the voltage or current of controlled delay elements.

Figure 5:
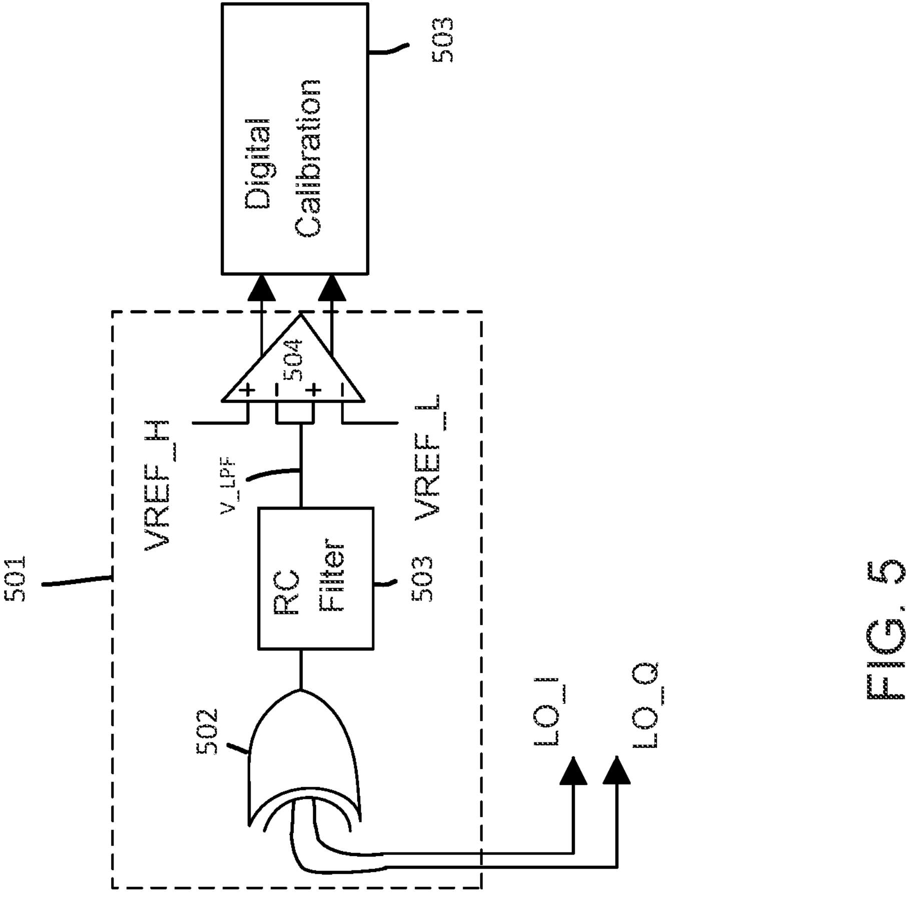
FIG. 5 illustrates a phase detector component and a digital calibration component, according to an embodiment.

FIG. 5 illustrates a phase detector component and a digital calibration component, according to an embodiment.

Referring to FIG. 5, the phase detector component 501 may correspond to the phase detector 106 of FIG. 1 and the digital calibration component 504 may correspond to the digital calibration logic 107 of FIG. 1.

The XOR gate 502 cascaded with the resistor capacitor (RC) filter 503 converts the time/phase difference between the Φ1_out signal (corresponding to LO_I) and the Φ2_out signal (corresponding to LO_Q) to a DC voltage.

The XOR gate has a range of 180 degrees. The output signal from the XOR gate 502 has a frequency double the input frequency. Notably, the pulse width of this doubled frequency signal is directly indicative of the phase difference between the Φ1_out and Φ2_out signals. To convert the time domain phase difference to DC voltage, the output of XOR gate 502 is passed through RC filter 503. The RC filter transforms the varying pulse width into a corresponding DC voltage. The magnitude of this DC voltage is a direct representation of the phase difference between Φ1_out and Φ2_out inputs. For example, when the Φ1_out and Φ2_out signals are perfectly aligned in phase (Φ=0 degrees), the output voltage is 0 and when they are perfectly out of phase (=180 degrees), the output is equivalent to the supply voltage, which may be denoted as VDD.

A comparator 504 in the phase detector component 501 then takes this DC voltage from the LPF and compares it to two reference voltages: VREF_H and VREF_L. These reference voltages may be used to set the desired phase requirement and its permissible error range. The difference between VREF_H and VREF_L dictates the accuracy or the acceptable error range for the phase difference.

If the DC voltage is outside the range set by VREF_H and VREF_L, it indicates that the phase difference between the Φ1_out and Φ2_out signals isn't within the desired specifications. The system then embarks on a calibration process. Using an open-loop approach, both coarse and fine calibrations may be performed to adjust the phase error to fall within the stipulated range. Thus, the system is capable of continuously monitoring, detecting, and correcting the phase difference between the Φ1_out and Φ2_out signals to ensure it remains within a specified range.

FIG. 6 is a table illustrating the resulting calibration based on comparator inputs, according to an embodiment.

Referring to FIG. 6, the table provides insight into the function of the comparator 503 included in the phase detector component 501 and subsequent calibration actions based on various scenarios. The table shows three different comparator scenarios and their associated outputs, phase error statuses, and both coarse and fine calibration actions.

In the first scenario, when the output of the RC filter 503, V_LPF, exceeds VREF_H, the comparator outputs OUT_H as 0 and OUT_L as 1 to the digital calibration component 503. This indicates a phase error greater than a designated error range A. As a result, the digital calibration component 503 may instruct both the coarse and fine calibration actions to increase the delay.

The second scenario arises when VREF_H is equal to or greater than V_LPF, and V_LPF is equal to or greater than VREF_L. Here, the comparator outputs to the digital calibration component 503 are OUT_H as 1 and OUT_L as 1, suggesting the phase error is within the range of ±Δ. The to the digital calibration component 503 does not necessitate any changes in this situation.

Furthermore, when V_LPF is less than VREF_L, the comparator 503 outputs OUT_H as 1 and OUT_L as 0 to the digital calibration component 503, revealing a phase error less than-A. This causes the digital calibration component 503 to reduce the delay for both the coarse and fine calibrations.

The design emphasizes an open-loop approach where both coarse and fine calibrations work either individually or in tandem to remain within the designated phase error. Coarse calibration may be achieved by increasing or decreasing MUX_SELECT on signals along the delay path.

At the end of the calibration, the programmable phase shift is applied along the delay path and is observed on the signal Φ1_out. This effectively changes the phase difference between Φ2_out and Φ1_out, and Φ1_out is reduced to 360/N−ΔΦ, where ΔΦ is the programmable phase shift being applied. The phases along the two reference paths are still separated out by 360/N. For a divide by 3 scenario, this value is 120 degrees. When considering only two consecutive phases of the divider, the max phase shift that can be programmed is 360/N.

The programmable phase shift range is extended beyond 360/N by selecting the signals Φ1_out and Φ3_out through output MUX's. The effective phase difference between these two signals is 720/N−ΔΦ extending the range.

Aspects of the programmable phase shift can be extended to a frequency division ratio≥3. For these scenarios above 3, more reference paths may be used so that output phase shift selection can be extended to 0 to 360.

Figure 7:
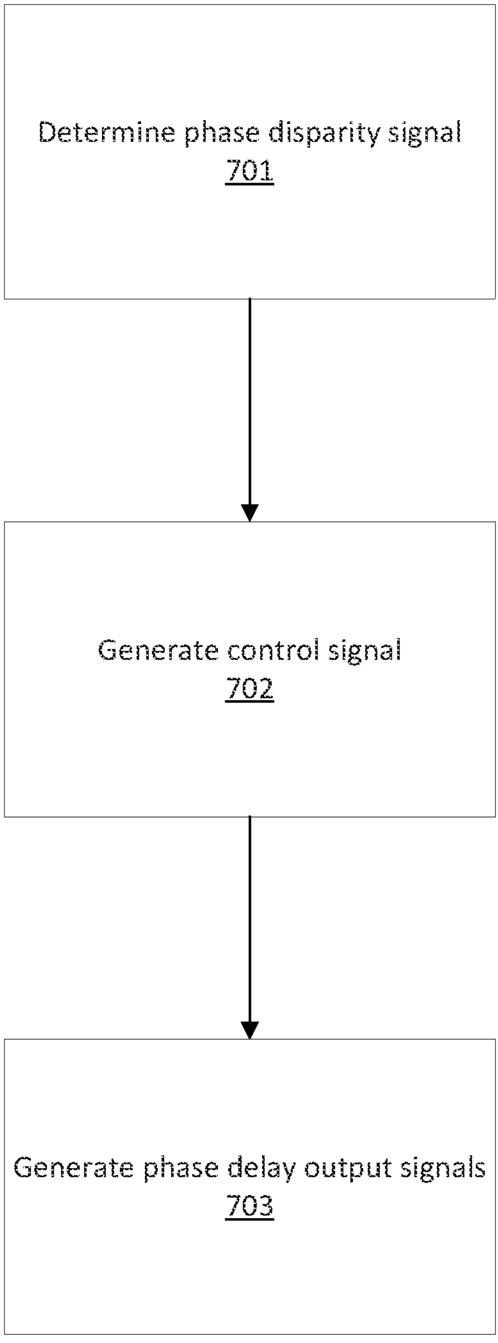
FIG. 7 illustrates a method for generating calibrated output signals, according to an embodiment.

FIG. 7 illustrates a method for generating calibrated output signals, according to an embodiment.

Referring to FIG. 7, in step 701, a phase disparity signal is determined. The phase disparity signal may be based on a phase error between outputs from a frequency divider cell.

In step 702, a control signal is generated. The control signal may be generated based on the phase disparity signal.

In step 703, phase delay output signals are generated. The phase delay output signals may be generated based on the control signal.

Figure 8:
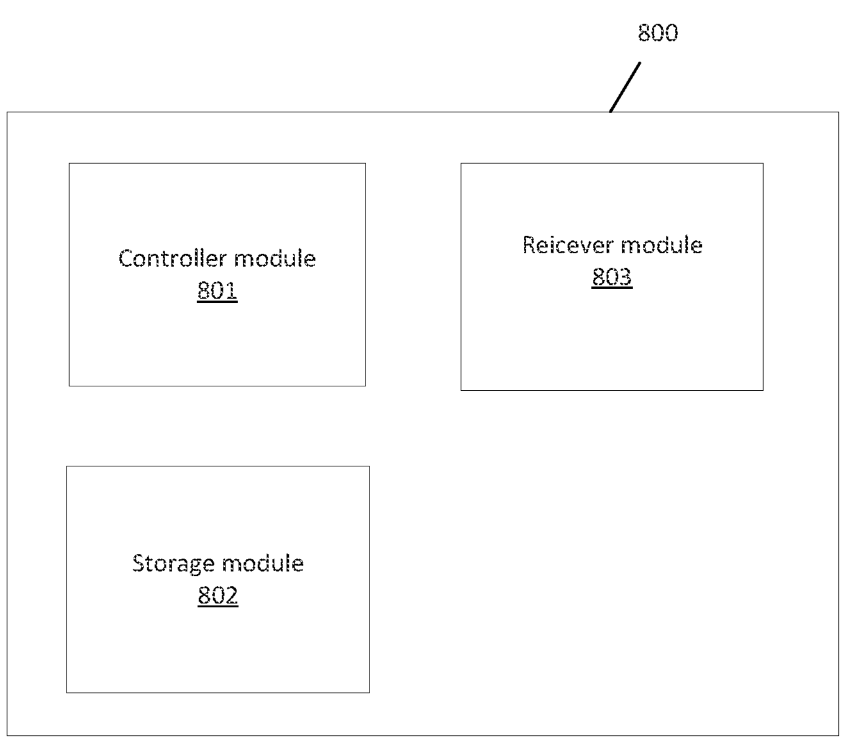
FIG. 8 is a block diagram illustrating an electronic device, according to an embodiment.

FIG. 8 is a block diagram illustrating an electronic device, according to an embodiment.

Referring to FIG. 8, an electronic device 800 includes a controller module 801, a storage module 802 and an receiver module 803.

The electronic device 800 of FIG. 8 may include, or include instructions to, means for executing the functions corresponding to the hardware components discussed above, with respect to FIGS. 1-7. Additionally, embodiments of the present disclosure may be implemented as part of a larger computer and/or network system comprising a CPU, memory, and instructions.

The electronic device 800 may be a user equipment (UE) capable of wirelessly communicating with external electronic devices, such as satellites and base stations, providing utility in diverse applications like navigation, data transmission, or satellite-based communication. For example, the electronic device 800 may be a GNSS receiver device.

The controller module 801 may serve as the computational and operational hub, orchestrating the synchronized working of the electronic device's 800 components. The controller module 801 may be embodied by a processor, a microprocessor or a microcontroller. The controller module 801 may interpret instructions, process data from satellites, and direct actions based on the processed data. For instance, in the context of a smartphone, the controller module 801 could be an advanced chipset, enabling not just communication with satellites but also supporting other multifaceted functionalities of the device. Moreover, the controller module 801 may execute instructions for generating the accurate and programmable phase delay output signals, discussed above.

The storage module 802 provides a repository for data, both transient and persistent. The storage module 802 may include memory units, such as random access memory (RAM) for temporary data storage and read-only memory (ROM) or flash memory for permanent data storage. The storage module 802 may store instructions enabling the controller module 801 to execute the functions corresponding to the hardware components described with respect to FIGS. 1-7.

The receiver module 803 is a communication link between the electronic device 800 and external devices, such as orbiting satellites. The receiver module 803 may be an antenna and receive wireless signals from external devices. For example, the receiver module 803 may be a GNSS receiver.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method for generating accurate and programmable phase delay output signals, the method comprising:

determining, via a phase detector unit, a phase disparity signal based on a phase error between two or more consecutive phase outputs of a frequency divider unit cell;

generating, via a digital calibration logic unit, a control signal based on the phase disparity signal; and generating, via a tunable delay lines unit, the phase delay output signals based on the control signal.

2. The method of claim 1, further comprising:

partitioning, via the frequency divider unit, a frequency of a signal received from a voltage-controlled oscillator (VCO) or a digitally-controlled oscillator (DCO) to obtain the frequency-divided signal.

3. The method of claim 1, wherein generating, via the tunable delay lines unit, the phase delay output signals based on the control signal further comprises:

generating a first output signal and a second output signal, wherein the control signal is configured to compensate for a phase difference between the first output signal and the second output signal.

4. The method of claim 1, wherein the digital calibration logic unit generates the control signal based on a determination of whether a value of the phase disparity signal is within a reference voltage range.

5. The method of claim 4, wherein generating, via the tunable delay lines unit, the phase delay output signals based on the control signal further comprises:

adjusting a delay, via the tunable delay lines unit, using a multiplexer selection path when the control signal indicates that the value of the phase disparity signal is not within the reference voltage range.

6. The method of claim 5, wherein adjusting the delay, via the tunable delay lines unit, using the multiplexer selection path further comprises recurrently inverting an input signal through a sequence of inverting delay units.

7. The method of claim 6, wherein adjusting the delay, via the tunable delay lines unit, further comprises adjusting a polarity of one or more of the phase delay output signals when the multiplexer selection path indicates an even-to-odd selection or an odd-to-even selection.

8. The method of claim 4, wherein generating, via the tunable delay lines unit, the phase delay output signals based on the control signal further comprises:

adjusting a delay, via the tunable delay lines unit, using a supply voltage when the control signal indicates that the value of the phase disparity signal is not within the reference voltage range.

9. The method of claim 4, wherein generating, via the tunable delay lines unit, the phase delay output signals based on the control signal further comprises:

abstaining from adjusting a delay, via the tunable delay lines unit, when the control signal indicates that the value of the phase disparity signal is within the reference voltage range.

10. The method of claim 1, wherein the digital calibration logic unit generates the control signal during, at least one of, a power-up operation or when a temperature has changed more than a threshold amount.

11. An electronic device for generating accurate and programmable output signals, the electronic device comprising:

a phase detector unit configured to determine a phase disparity signal based on a phase error between two or more consecutive phase outputs of a frequency divider unit cell;

a digital calibration logic unit configured to generate a control signal based on the phase disparity signal; and a tunable delay lines unit configured to generate the phase delay output signals based on the control signal.

12. The electronic device of claim 11, wherein the frequency divider unit is configured to partition a frequency of a signal received from a voltage-controlled oscillator (VCO) or a digitally-controlled oscillator (DCO) to obtain the frequency-divided signal.

13. The electronic device of claim 11, wherein the tunable delay lines unit is further configured to:

generate a first output signal and a second output signal, wherein the control signal is configured to compensate for a phase difference between the first output signal and the second output signal.

14. The electronic device of claim 11, wherein the digital calibration logic unit is further configured to generate the control signal based on a determination of whether a value of the phase disparity signal is within a reference voltage range.

15. The electronic device of claim 14, wherein the tunable delay lines unit is further configured to:

adjust a delay using a multiplexer selection path when the control signal indicates that the value of the phase disparity signal is not within the reference voltage range.

16. The electronic device of claim 15, wherein adjusting the delay using the multiplexer selection path further comprises recurrently inverting an input signal through a sequence of inverting delay units.

17. The electronic device of claim 16, wherein adjusting the delay using the multiplexer selection path further comprises adjusting a polarity of one or more of the phase delay output signals when the multiplexer selection path indicates an even-to-odd selection or an odd-to-even selection.

18. The electronic device of claim 14, wherein the tunable delay lines unit is further configured to:

adjust a delay using a supply voltage when the control signal indicates that the value of the phase disparity signal is not within the reference voltage range.

19. The electronic device of claim 14, wherein the tunable delay lines unit is further configured to:

abstain from adjusting a delay when the control signal indicates that the value of the phase disparity signal is within the reference voltage range.

20. The electronic device of claim 11, wherein the digital calibration logic unit is further configured to generate the control signal during, at least one of, a power-up operation or when a temperature has changed more than a threshold amount.

* * * * *